United States Patent
Jain (10) Patent No.: US 10,244,451 B2
(45) Date of Patent: Mar. 26, 2019

(54) SEAMLESS APPLICATION CONNECTIVITY

(71) Applicant: Google LLC, Mountain View, CA (US)

(72) Inventor: Arvind Jain, Los Altos, CA (US)

(73) Assignee: Google LLC, Mountain View, CA (US)

( * ) Notice: Subject to any disclaimer, the term of this patent is extended or adjusted under 35 U.S.C. 154(b) by 92 days.

(21) Appl. No.: 14/967,550

(22) Filed: Dec. 14, 2015

(65) Prior Publication Data

US 2016/0112919 A1 Apr. 21, 2016

Related U.S. Application Data

(63) Continuation of application No. 14/036,283, filed on Sep. 25, 2013, now Pat. No. 9,241,292.

(51) Int. Cl.
*H04W 36/18* (2009.01)
*H04L 29/08* (2006.01)
*H03C 1/16* (2006.01)

(52) U.S. Cl.
CPC .......... *H04W 36/18* (2013.01); *H04L 69/321* (2013.01); *H03C 1/16* (2013.01)

(58) Field of Classification Search
CPC ............. H04W 52/02; H04W 52/0216; H04W 52/0229; H04W 84/12; H04W 84/18
See application file for complete search history.

(56) References Cited

U.S. PATENT DOCUMENTS 6,674,746 B1 1/2004 Lamarque
6,725,044 B2 4/2004 Verma et al.

(Continued)

FOREIGN PATENT DOCUMENTS

WO 2001076276 10/2001
WO 2005119978 12/2005

OTHER PUBLICATIONS

'Android and Me' [online]. "First Android devices with WiFi Display will be powered by Qualcomm's Snapdragon," 2012, [retrieved on 2012. Retrieved from the Internet: URL:<http://androidandme.com/2012/01/news/first-android-devices-with-wi-fi-display-will-be-powered-by-qualcomms-snapdragon/#comments> 13 pages.

(Continued)

*Primary Examiner* — Gbemileke J Onamuti
*Assistant Examiner* — Sanjay K Dewan
(74) *Attorney, Agent, or Firm* — Fish & Richardson P.C.

(57) ABSTRACT

In some implementations, a request to switch to using a second network connection is received at a first computing device that is currently communicating with a second computing device over a first network connection. While still using the first network connection, the second network connection may be initiated. During a period of transition, the first computing device may communicate with the second computing device using both the first network connection and the second network connection. To use both the first and second network connections, data from the second computing device may be received over the first network connection, and data may be sent to the second computing device over the second network connection. The first computing device may identify an end of the period of transition. In response, the first computing device may communicate with the second computing device using only the second network connection.

17 Claims, 7 Drawing Sheets

(56) References Cited

U.S. PATENT DOCUMENTS

| | | | |
|---|---|---|---|
| 6,738,373 B2 | 5/2004 | Turner | |
| 6,987,743 B2 | 1/2006 | Chen et al. | |
| 7,072,652 B2* | 7/2006 | Stephens | H04W 36/26 |
| | | | 455/424 |
| 7,136,645 B2 | 11/2006 | Hanson et al. | |
| 7,170,871 B2 | 1/2007 | Eyuboglu et al. | |
| 7,190,781 B2* | 3/2007 | Beltran | H04Q 3/0025 |
| | | | 370/352 |
| 7,353,027 B2 | 4/2008 | Karagiannis et al. | |
| 7,426,178 B2 | 9/2008 | Guo et al. | |
| 8,000,708 B1* | 8/2011 | Woleben | H04W 36/026 |
| | | | 370/329 |
| 8,005,988 B2 | 8/2011 | Maes | |
| 8,037,188 B2* | 10/2011 | Li | H04L 12/66 |
| | | | 370/331 |
| 8,046,452 B2* | 10/2011 | Hovell | H04L 29/06 |
| | | | 709/201 |
| 8,078,164 B2 | 12/2011 | Ganesan | |
| 8,351,327 B1* | 1/2013 | Binns | H04L 67/322 |
| | | | 370/229 |
| 8,446,453 B2* | 5/2013 | Tian | H04L 12/1822 |
| | | | 348/14.01 |
| 8,606,954 B1 | 12/2013 | Abidogun et al. | |
| 8,638,717 B2* | 1/2014 | Chen | H04W 36/00 |
| | | | 370/328 |
| 8,750,263 B2* | 6/2014 | Kezys | H04L 12/66 |
| | | | 370/338 |
| 8,971,194 B2* | 3/2015 | Tofighbakhsh | H04W 52/0251 |
| | | | 370/241 |
| 9,049,042 B2* | 6/2015 | Tagg | H04L 12/2856 |
| 9,930,560 B2* | 3/2018 | Wang | H04W 76/12 |
| 2004/0082337 A1 | 4/2004 | Lacroix et al. | |
| 2005/0271014 A1 | 12/2005 | Gillies et al. | |
| 2005/0286466 A1* | 12/2005 | Tagg | H04L 12/2856 |
| | | | 370/329 |
| 2006/0034290 A1* | 2/2006 | Kalofonos | H04L 67/16 |
| | | | 709/227 |
| 2006/0153124 A1 | 7/2006 | Kant et al. | |
| 2006/0173930 A1* | 8/2006 | Soini | G06F 17/30575 |
| 2006/0199586 A1 | 9/2006 | Yoon | |
| 2007/0135102 A1 | 6/2007 | Kister et al. | |
| 2007/0265003 A1 | 11/2007 | Kezys et al. | |
| 2008/0146230 A1 | 6/2008 | Pandian et al. | |
| 2008/0259871 A1 | 10/2008 | Baek et al. | |
| 2008/0285518 A1 | 11/2008 | Dutta et al. | |
| 2009/0116435 A1 | 5/2009 | Koorapaty et al. | |
| 2009/0124284 A1 | 5/2009 | Scherzer et al. | |
| 2009/0191878 A1 | 7/2009 | Hedqvist et al. | |
| 2010/0150110 A1 | 6/2010 | Dutta et al. | |
| 2010/0260146 A1 | 10/2010 | Lu | |
| 2010/0272049 A1 | 10/2010 | Tung et al. | |
| 2011/0164735 A1* | 7/2011 | Yuan | H04L 65/4015 |
| | | | 379/93.08 |
| 2011/0182270 A1 | 7/2011 | Shaheen et al. | |
| 2012/0108277 A1 | 5/2012 | Chan et al. | |
| 2012/0127955 A1 | 5/2012 | Gandham et al. | |
| 2012/0163344 A1 | 6/2012 | Bakthavathsalu et al. | |
| 2013/0022030 A1 | 1/2013 | Hillier | |
| 2013/0029639 A1 | 1/2013 | Lee et al. | |
| 2013/0039343 A1 | 2/2013 | Hon i et al. | |
| 2013/0155976 A1 | 6/2013 | Chen et al. | |
| 2013/0229976 A1 | 9/2013 | Srinivasan et al. | |
| 2013/0230023 A1 | 9/2013 | Gray et al. | |
| 2013/0272266 A1* | 10/2013 | Nishida | H04W 36/0022 |
| | | | 370/331 |
| 2014/0112305 A1* | 4/2014 | Dayanandan | H04W 48/16 |
| | | | 370/331 |
| 2014/0119195 A1* | 5/2014 | Tofighbakhsh | H04W 52/0251 |
| | | | 370/241 |
| 2014/0189160 A1 | 7/2014 | Haddad et al. | |
| 2014/0355522 A1* | 12/2014 | Diab | H04W 88/06 |
| | | | 370/328 |
| 2015/0365316 A1* | 12/2015 | Liao | H04L 45/66 |
| | | | 709/223 |
| 2016/0127411 A1* | 5/2016 | Sommer | G06Q 20/12 |
| | | | 726/23 |
| 2016/0269876 A1* | 9/2016 | Senese | H04L 61/106 |
| 2017/0238224 A1* | 8/2017 | McKibben | H04W 36/18 |
| | | | 370/331 |

OTHER PUBLICATIONS

'Android Authority' [online] "WiFi Display to Make Your Life Easier in 2012," 2012, [retrieved on Oct. 27, 2012]. Retrieved from the Internet: URL:< www.androidauthority.com/wifi-display-to-make-your-life-easier-in-2012-47153/> 7 pages.

'Intel® Wireless Networking' [online]. "Intel® Wireless Display, Issue using Intel® Wireless Display with WiMAX," 2011, [retrieved on Oct. 29, 2012]. Retrieved from the Internet: URL:<www.intel.com/support/wireless/wtech/iwd/sb/CS-031661.htm> 1 page.

"3G/Wi-Fi Seamless Offload," Qualcomm, Incorporated, Mar. 2010, 11 pages.

"Cisco Mobile VPN-Enabling Cisco End-Device Based IP Mobility," last updated Feb. 2006, 19 pages.

"Mobile data offloading," from Wikipedia, the free encyclopedia last modified Jul. 16, 2013, downloaded from the internet on Jul. 23, 2013 at www.wikipedia.org.wiki.Mobile_data_offloading, 4 pages.

Alkhawlani, Mohammed M. "Multi-Criteria Vertical Handover for Heterogonous Networks," International Journal of Wireless & Mobile Networks (IJWMN), vol. 3, No. 2, Apr. 2011, 15 pages.

Chen, Beizhong et al., "Fast Handover for Multiple-Interface Mobile Devices Connecting to a Single Foreign Agent in MIPv4 with MIH Support," IEEE ICC 2009, 5 pages.

Ekiz, Nauf et al., "An Overview of Handoff Techniques in Cellular Networks," International Journal of Information and Communication Engineering, Feb. 6, 2006, 5 pages.

Ford, A., et al., "Architectural Guidelines for Multipath TCP Development," Internet Engineering Task Force (IETF) Mar. 2011, 58 pages.

Handa, Arun, "Mobile Data Offload for 3G Networks," A Whitepaper, IntelliNet Technologies, Oct. 2009, 7 pages.

Nguyen, Thinh P.Q., "Path Diversity Media Streaming over Best Effort Packet Networks," a dissertation submitted in partial satisfaction of the requirements for the degree of Doctor of Philosophy in Engineering—Electrical Engineering and Computer Sciences in the Graduate Division of the University of California at Berkeley, 2000, 185 pages.

Paasch, Christoph et al., "Exploring Mobile/WiFi Handover and Multipath TCP," CellNet '12, Aug. 13, 2013, Helsinki, Finland, 6 pages.

Pan, Yi et al., "An End-to-End Multi-Path Smooth Handoff Scheme for Stream Media," WMASH '03, Sep. 19, 2003, San Diego, CA, 12 pages.

ParandehGheibi, Ali et al., "Access-Network Association Policies for Media Streaming in Heterogeneous Environments," submitted to CDC Apr. 20, 2010, 8 pages.

Tüysüz, Ayşgül et al., "Handovers in Wireless Overlay Networks Based on Mobile IPV6," Conference on Academic Information '05 (Akademik Bilişim 2005), Gaziantep, Turkey, 2005, 10 pages.

Venkataraman, Narendra, "Inside Mobile IP," Dr. Dobb's The World of Software Development, Sep. 1, 2005, 7 pages.

Ward, Torbjorn, Reality Check: Seamless Wi-Fi off-load—A business opportunity for mobile operators, Jun. 23, 2010, www.rcrwireless.com/article/20130625/opinion/reality-check-seamless-wi-fi-off-load-a-business-opportunity-mobile-operators/, 5 pages.

\* cited by examiner

SEAMLESS APPLICATION CONNECTIVITY

CROSS-REFERENCE TO RELATED APPLICATION

This application is a continuation of U.S. application Ser. No. 14/036,283, filed Sep. 25, 2013, the contents of which are incorporated by reference.

TECHNICAL FIELD

This specification generally describes computer-based technology for seamlessly transition between network connections on a computing device.

BACKGROUND

Computing devices, such as smartphones and tablet computing devices, have included various communications interfaces, such as wireless communication interfaces, for communicating over various types of networks, such as wireless networks (e.g., 3G, 4G LTE, 4G WiMAX, WiFi, BLUETOOTH). Computing devices, such as mobile computing devices, have been configured to automatically switch between communication networks, such as automatically switching from using fee-based wireless data networks, such as 3G and/or 4G wireless data networks for which a fee (e.g., monthly subscription) is charged for access, to using free wireless data networks, such as WiFi networks, when an access point for such a free wireless network is within range of a mobile computing device.

SUMMARY

This document describes techniques, methods, systems, and computer program products for transitioning between network connections in a seamless manner so that data streams being received/sent by applications running on a computing device are not interrupted. Such seamless transitioning can be provided using endpoint-based solutions. For example, a middleware layers (e.g., application programming interface (API)) on a computing device can be used to provide applications and other programs running on the computing devices with a consistent and unchanged address (e.g., IP address) for other computing devices even when the computing device is switching between network connections (e.g., transitioning between a mobile data network and a WiFi network connection, transitioning between a wired network connection and a wireless network connection). Additionally, such middleware layers can manage and use network connections simultaneously (e.g., read and write simultaneously across multiple network connections) so that the computing device can continue to send and receive data with other computing devices without interruption while transitioning between network connections.

In one implementation, a method performed by data processing apparatus includes: receiving, at a first computing device that is currently communicating with a second computing device over a first network connection, a request to switch to using a second network connection; initiating, while still using the first network connection, the second network connection; communicating, by the first computing device during a period of transition from the first network connection to the second network connection, with the second computing device using both the first network connection and the second network connection, wherein using both the first and second network connections comprises: receiving data from the second computing device over the first network connection, and sending data to the second computing device over the second network connection; identifying, by the first computing device, an end of a period of transition; and communicating, by the first computing device and in response to identifying the end of the period of transition, with the second computing device using only the second network connection.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

Implementations may include one or more of the following features. For instance, the communicating with the second computing device using both the first network connection and the second network connection is managed by a middleware layer that is running on the first computing device, the middleware layer acting as an intermediate network layer between an application layer and a kernel layer on the first computing device. The middleware layer comprises an application programming interface. The middleware layer maps the first network connection and the second network connection to a single connection alias that is used by the application layer to communicate with the second computing device. The identifying comprises receiving notice that the first network connection has closed. The notice is provided by a socket API of the first computing device. The identifying comprises receiving, over the first network connection, information that indicates that the first network connection has been terminated by the second computing device. The identifying comprises identifying expiration of a timer that is associated with the switch from the first network connection to the second network connection has expired. The method or the actions performed include providing a notification to the second computing device regarding the switch from the first network connection to the second network connection.

Implementations may include one or more of the following features. For instance, the method or the actions performed include: determining whether the communication between the first computing device and the second computing device is bounded; identifying whether the second computing device is configured to use connection aliasing for the first and second network connections; and determining, based on (i) the determination of whether the communication is bounded and (ii) whether the second computing device is configured to use connection aliasing for the first and second network connections, whether to proceed with switching between the first and second network connections using the first and second network connections simultaneously. Proceeding with the switching is determined when the communication is determined to be bounded regardless of the configuration of the second computing device, and the sending of the data to the second computing device over the second network connection is based on a reissued range request. Proceeding with the switching is determined when the communication is determined to not be bounded and the second computing device is configured to seamlessly transition between the first and second network connections. Communication over hypertext transfer protocol (HTTP) is determined to be bounded. Streaming audio or video content is determined to not be bounded.

Certain implementations may provide one or more of the following advantages. For example, seamless network transitions can be more widely and easily implemented by using endpoint-based solutions. For instance, so long as one or more computing devices that are communicating with each other includes a component (e.g., middleware layer) to provide seamless network transitions, the data transmissions between the computing devices can be maintained without interruption even when one or more of the computing devices transitions to a different network connection. Additionally, applications are able to operate using this system without modification, which can increase the ease of deployment and use across different applications and computing environments.

In another example, user experience and application performance can be improved. For instance, transitioning between network connections can cause one or more applications that are using network connectivity on a computing device to hang until the new connection has established. In some instances, a hang-up can terminate the operation performed by the application, such as dropping a telephone call (e.g., VoIP telephone call) that is being provided by a computing device. The disclosed technology can allow for such hang-ups and, in some instance, application failures to be avoided while transitioning between network connections.

The details of one or more implementations of the subject matter described in this specification are set forth in the accompanying drawings and the description below. Other potential features, aspects, and advantages of the subject matter will become apparent from the description, the drawings, and/or the claims.

BRIEF DESCRIPTION OF DRAWINGS

Like reference symbols in the various drawings indicate like elements.

DETAILED DESCRIPTION

This document generally describes techniques, methods, systems, and computer program products for seamlessly transitioning between network connections on a computing device, such as mobile computing devices (e.g., smartphones, tablet computing devices), laptops, desktop computers, servers, and other appropriate computing devices. For example, a middleware layer (e.g., API) can be used on a computing device that hides the underlying physical network details from applications running on the computing device but otherwise provides the same networking interface to applications. The applications can use the middleware layer instead of directly using the underlying network through network APIs, which can allow applications to seamlessly transition between network connections without modification or additional configuration. The middleware layer can take care of handling network changes and making sure that applications can still communicate with its peer on another computing device without any disruption in service during network connection switches.

As an illustrative example, consider user U1 on mobile computing device M1 in a VoIP telephone call (e.g., telephone call through GOOGLE VOICE) with user U2 on mobile computing device M2. The mobile computing device M1 can be connected to the Internet (example network) either via the WiFi interface (W1) or carrier 3G/4G interface (C1). When the device M1 is connected to W1, the IP address of device M1 can be IPW1, and when it is connected to C1, its IP address can be IPC1.

The VoIP applications on both ends can have access to a network connection between M1 and M2. Assume that when the call starts, M1 is on network interface C1 (with IP address IPC1) and the network connection between M1 and M2 is represented IPC1-IP2, where IP2 is the IP address of U2. The VoIP applications on both M1 and M2 can be able to read and write on this connection (IPC1-IP2). Suppose that during the communication between M1 and M2 over the connection the mobile device M1 switches from using C1 to using W1 as the network interface. Without the technology described in this document, such a switch would terminate the IPC1-IP2 connection, and the VoIP application would return a call failure to the user.

To avoid such a negative outcome as a result of switching from C1 to W1, a middleware layer can be introduced between the application and kernel layer (e.g., operating system). Such a middleware layer can allow applications to create network connections to their peers, but the middleware layer can handle and hide the underlying network connections from the applications. The middleware layer can represent the connection between M1 and M2 as a general/abstracted connection between the two devices (e.g., M1-M2) instead of providing the application with the network layer details of the current connection between the devices (e.g., IPC1-IP2).

While using such a middleware layer, if the operating system and/or the user U1 of device M1 attempts to use W1 instead of C1, the middleware layer can activate W1 in parallel with the currently open connection C1. A middleware layer may receive a notification of an impending change from C1 to W1 through any of a variety of appropriate mechanisms, such as via socket API. The new middleware layer can process this notification, and can create a new connection IPW1-IP2, which is different from the pre-existing connection IPC1-IP2. With two connections open, a middleware layer can start to put new data that an application writes on the new connection (IPW1-1P2), while still reading from the old connection (IPC1-IP2).

On the peer side, a middleware layer can do the same thing—establish a second network connection and can begin to write to the new network connection while reading from the old connection that will be, but has not yet been, terminated. Once there is no data left on the network on the original connection IPC1-IP2, the middleware can shut down that connection. In some implementations, the middleware layer may additionally and/or alternatively use a timer to determine when the shut down the original connection (e.g., shut down IPC1-IP2 after 10 seconds of both connections being open). Using this configuration, there is no impact on the VoIP applications performance when the operating system decides to disable C1—the VoIP application of device M1 can continue to seamlessly communicate with its peer application running on device M2.

FIGS. 1A-1D depict a conceptual diagram of an example computer system for providing seamless application connectivity. The example system includes a first computing device M1 (100) that provides seamless connectivity while switching network connections during communication with second computing device M2 (102). The first computing device M1 (100) and the second computing device M2 (102) can be any of a variety of appropriate computing devices, such as mobile computing devices (e.g., smartphones, tablet computing devices, personal digital assistants, mobile media players), laptop computers, desktop computers, and/or computer servers.

Figure 1A:
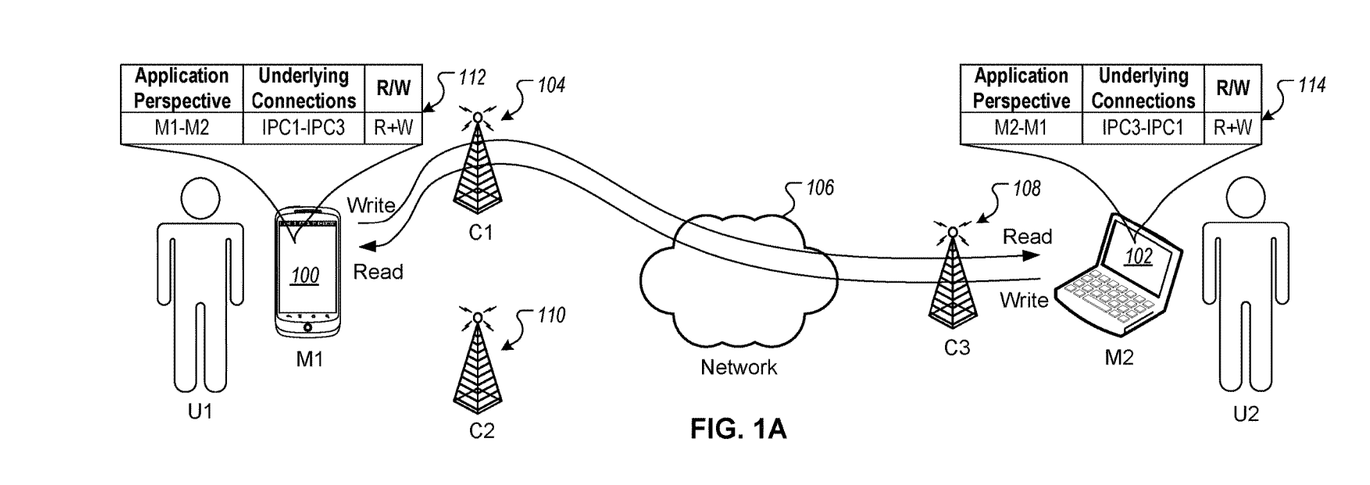
FIGS. 1A-1D depict a conceptual diagram of an example computer system for providing seamless application connectivity.

Referring to FIG. 1A, the first computing device M1 (100), which is depicted as being a smartphone but which can be any of a variety of other appropriate computing devices, is communicating with the second computing device M2 (102) over network interface C1 (104) for M1, one or more networks 106, and network interface C3 (108) for M2. The network interfaces C1 (104) and C3 (108) can be any of a variety of appropriate network connections using any of a variety of appropriate interfaces and protocols. For example, the network interfaces C1 (104) and C3 (108) can be wireless network connections (e.g., WiFi connections, mobile data network connections (e.g., 3G wireless connection, 4G wireless connection), BLUETOOTH connection) and/or wired network connections (e.g., Ethernet connection, tethered data connection). The network 106 can include one or more appropriate communication networks, such as the internet, a local area network (LAN), and/or a wide area network (WAN), a virtual private network (VPN).

In the example depicted in FIG. 1A, the first computing device M1 (100) is reading and writing over the network interface C1 (104) to communicate with the second computing device M2 (102). For example, the communication between the first computing device M1 (100) and the second computing device M2 (102) may be part of a voice or video chat session, and the first computing device M1 (100) may be transmitting detected audio and/or video signals to the second computing device M2 (102) by writing over the network interface C1 (104). Additionally, the first computing device M1 (100) may be receiving audio and/or video signals that have been detected and transmitted by the second mobile computing device M2 (102) by writing over the network interface C3 (108). Data that is transmitted between the first and second computing devices can be written and read using any of a variety of data encoding and transmission protocols, such as application layer protocols (e.g., HTTP, FTP, RTP, RTSP), transport layer protocols (e.g., UDP, TCP), internet layer protocols (e.g., IP), and/or link layer protocols (e.g., ARP, RARP, NDP).

As depicted in table 112, the first computing device M1 (100) can maintain records of current network connections and the corresponding addresses (e.g., IP addresses) that are associated with the endpoints of the network connections, meaning the first computing device M1 (100) and the second computing device M2 (102). For example, the underlying connection for the communication depicted in FIG. 1A is indicated as "IPC1-IPC3," where IPC1 corresponds to the IP address for the first computing device M1 (100) with network interface C1 (104) and IPC3 corresponds to the IP address for the second computing device M2 (102) with the network interface C3 (108). The table 112 also depicts an alias that is used to represent the connection between the first computing device M1 (100) and the second computing device M2 (102) so as to abstract the connection away from the specific connection details, such as the IP addresses for the connection, and to instead focus on identification of the endpoints (e.g., the first computing device M1 and the second computing device M2). For instance, the example alias that is used to abstract the underlying connection between the first computing device M1 (100) and the second computing device M2 (102) is "M1-M2." An alias can provide information that identifies the connection without being specifically tethered to one or more of the specific addresses that are used for the computing devices that form the endpoints of the connection.

Applications, programs, services, and other processing components that are running on the first and second computing devices at the application layer may not be configured to seamlessly handle and adapt to addressing changes for the computing devices. For instance, a VoIP application that is running on the first computing device M1 (100) and that is participating in a phone call with the second computing device M2 (102) over the network interface C1 (104), the network 106, and the network interface C3 (108) may drop the call if the first computing device M1 (100) switches from using network interface C1 (104) to using the network interface C2 (110), causing the address (e.g., IP address) that is associated with the endpoints of the communication to change (e.g., the IP address for M1 changes from IPC1 to IPC2). By using an alias that abstracts the end-to-end connection away from the actual addresses that are used as part of the connection, as depicted in the table 112, such a change from the network interface C1 to C2, may not affect the performance of the application that is using the connection.

As depicted in the example, the second computing device M2 (102) can use similar records that include an alias for the connections between the second computing device M2 and the first computing device M1, as depicted in table 114. The tables 112 and 114 can be maintained and used one or more of a variety of computing components on the first and second computing devices, such as by one or more middle layers that are intermediate the application layer and the kernel/operating system (OS) layer. An example of such a middle layer is an application programming interface (API).

Figure 1B:
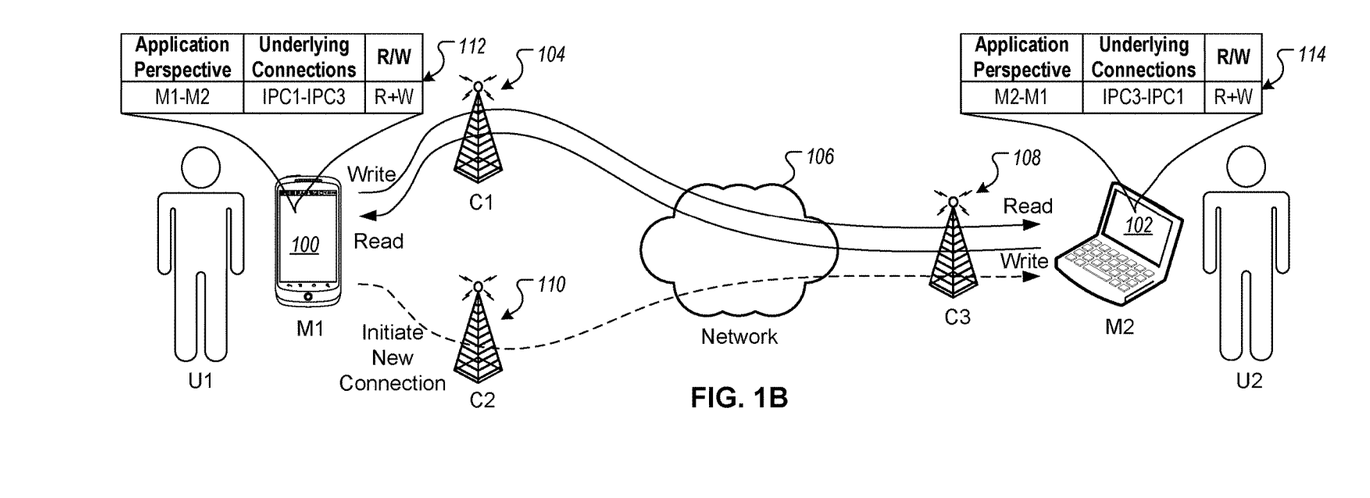

Referring to FIG. 1B, while the communication with the second computing device M2 (102) is taking place, the first computing device M1 (100) initiates a new connection using network interface C2 (110). For example, the first computing device M1 (100) may include connection-based rules that cause the computing device M1 to switch between network connections or interfaces, such as automatically switching from a mobile data network connection (e.g., 3G network data connection, or a 4G network data connection) to a WiFi network connection when a free/non-fee/public WiFi connection becomes available to the first computing device M1. In another example, the first computing device M1 may be configured to automatically switch from a wireless network connection to a wired network connection becomes accessible (e.g., plugging a wired connection into the first computing device M1 (100)). In another example, a user U1 of the first computing device M1 (100) may manually instruct the device M1 to establish and use the network interface C2 instead of the network interface C1. In response to such an event (e.g., satisfaction of conditions for an automatic switch, manual selection of a different network connection), the first computing device M1 (100) can initiate the connection over network interface C2 (110) and with the second computing device M2 (102) through the new connection over network interface C2 (110), the network 106, and the network interface C3 (108).

Figure 1C:
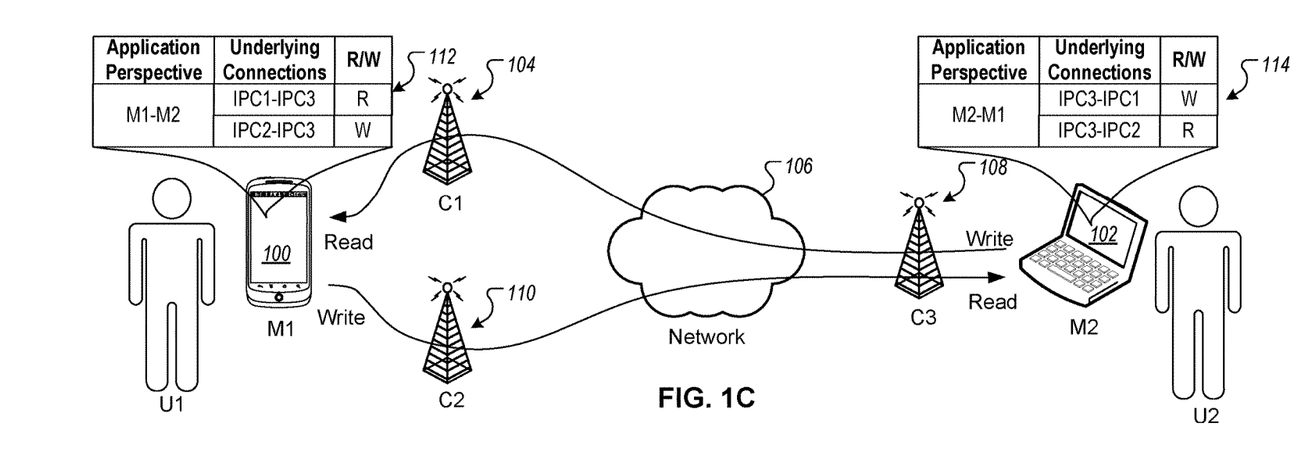

Referring to FIG. 1C, in response to initiating the new connection through network interface C2 (110), the first computing device M1 (100) can begin a period during which communication with the second computing device M2 (102) occurs simultaneously over the old connection over network interface C1 (104) and the new connection over network interface C2 (110). During such a period, the first computing device M1 (100) can read over the old connection over network interface C1 (104) and write over the new connection over network interface C2 (110). As indicated in the table 112, records used by the first computing device M1 (100) can be updated to include an entry for the new underlying connection over network interface C2 (110) while still including the entry for the old underlying connection over network interface C1 (104). For instance, the table 112 in FIG. 1C includes the entries "IPC1-IPC3" for the old connection over network interface C1 (104) and "IPC2-IPC3" for the new connection over network interface C2 (110). As indicated in the table 112, the old connection over network interface C1 (104) is identified as the connection over which reading is occurring (indicated by the CR' designation) and the new connection over network interface C2 (110) is identified as the connection over which writing is occurring (indicated by the W designation). Both of these entries can be associated with the alias for the abstract connection between the endpoints (M1 and M2), as indicated by the table 112. During this period of transition, computing entities that are accessing the application on device M1 (100) to communicate with device M2 (102) can continue to use the same addressing scheme for the connection ("M1-M2") even though two different network interfaces or connections are being used simultaneously to provide the connection.

As indicated by the table 114 that is associated with the second computing device M2 (102), the second computing device M2 can update its alias scheme in a similar manner in response to the new connection over network interface C2 (110) that has been initiated by the first computing device M1 (100). For instance, the alias (M2-M1) for the connection from the perspective of the second computing device M2 (102) is associated with underlying connections "IPC3-IPC1," which is the old connection over which the second computing device M2 is writing, and "IPC3-IPC2," which is the new connection over which the second computing device M2 is reading from the first computing device M1.

The duration of this period over which the old connection (C1—network—C3) and the new connection (C2—network—C3) are used simultaneously can be determined in any of a variety of appropriate ways. In one example, the duration may be based transmission of data that had been queued/buffered by the second computing device M2 (102) when the old network connection IPC2-IPC3 was received. For instance, the second computing device M2 (102) may have data that has been queued/buffered for transmission to the first computing device M1 (100) when notification and/or initiation of the old network connection IPC2-IPC3 was received. The duration of the simultaneous use of the old network connection IPC1-IPC3 and the old network connection IPC2-IPC3 may persist from the initiation of the old network connection IPC2-IPC3 to a later period of time when all of the data that was queued/buffered has been transmitted over the old network connection using network interface C1 (104).

In another example, the duration of the simultaneous use of the old network connection IPC1-IPC3 and the old network connection IPC2-IPC3, as depicted in FIG. 1C, may be based on a predetermined threshold of data and/or time having been met. For instance, the old and new connections may be simultaneously used for a threshold period of time (e.g., 0.1 seconds, 0.5 seconds, 1 second, 5 seconds, 10 seconds). In another example, the old and new connections may be simultaneously used until a threshold amount of data has been written over the old connection and/or read from the new connection by the second computing device M2 (102).

Determination and notification that the period for simultaneously using both the old network connection IPC1-IPC3 and the old network connection IPC2-IPC3 can be made by the first computing device M1 (100) and/or the second computing device M2 (102). For instance, once the queued/buffered data has been transmitted by the second computing device M2 (102), the second computing device M2 (102) can close the old network connection (e.g., close a socket for the connection IPC3-IPC1) which can cause the first computing device M1 (100) to be notified of the closed connection. In another example, the second computing device M2 (102) can transmit a notification to the first computing device M1 (100) that signals that use of the old connection IPC3-IPC1 is ending.

Figure 1D:
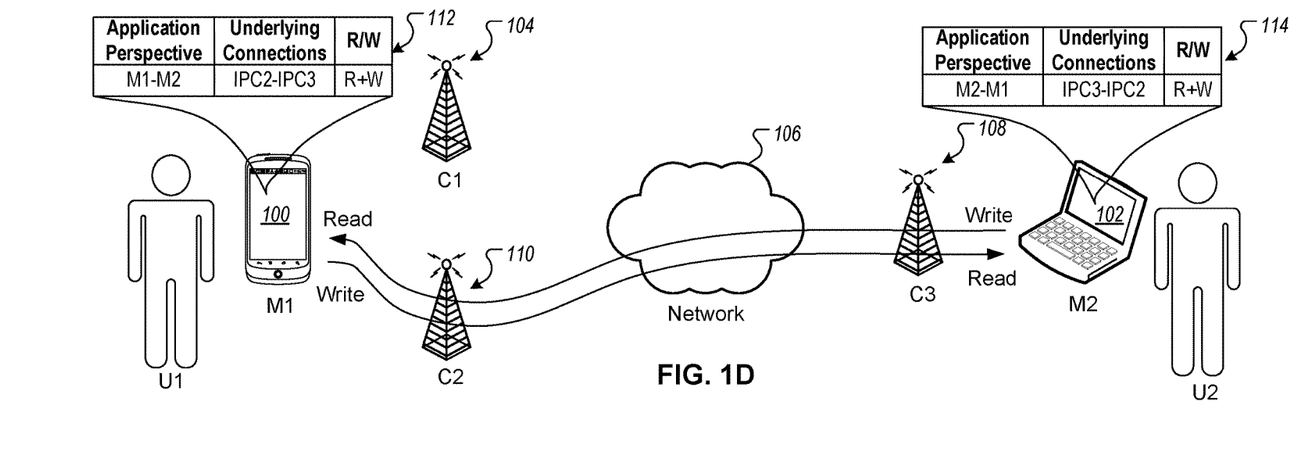

Referring to FIG. 1D, after the old network connection IPC1-IPC3 has been terminated, the first computing device M1 (100) and the second computing device M2 (102) can transition to using only the new network connection IPC2-IPC3. This transition can be made complete by updating the entries in the tables 112 and 114. For instance, the entries for the old network connection IPC1-IPC3 can be removed from both of the tables 112 and 114, and the entry for the new network connection IPC2-IPC3 can be updated to indicate that it is available for both reading and writing ("R+W"). Even though the computing devices M1 and M2 have gone through three separate stages (old connection only, old and new connection simultaneously, and new connection only), the alias for the communication between the first and second computing device M1 and M2 has remained consistent ("M1-M2") during the transition. Such consistency in spite of a new address (IPC2) being introduced for the first computing device M1 (100) can permit applications and other computing entities (e.g., services, programs) that are running on the first computing device M1 (100) to continue to transmit data to the second computing device M2 without interruption and without having to be modified themselves to handle such situations.

The seamless connectivity between the computing device M1 and M2 that is depicted through FIGS. 1A-1D is provided based on the first computing device M1 (100) and the second computing device M2 (102) being configured to generate and use aliases for the underlying connections, and to bifurcate reading and writing so that the old network connection IPC1-IPC3 is wound down while the new network connection IPC2-IPC3 is established. As indicated above, such configuration to generate and use aliases can be provided through one or more mechanisms on the computing device M1 and M2, such as a middleware layer (e.g., API). Such a middleware layer may be implemented in any of a variety of ways on the computing devices M1 and M2, such as through software, hardware (e.g., application specific integrated circuit (ASIC)), and/or firmware. Although FIGS. 1A-1D depict both endpoints (M1 and M2) of the communication as being configured to use aliases, both endpoints do not need to have such configurations to provide seamless connectivity when network connections are changed. As described in greater detail below, for connections that are based on bounded data sets (e.g., file transmissions) instead of potentially infinite data sets (e.g., streaming content), seamless connectivity may be provided when only one of the endpoints is able to alias the underlying network connections.

FIGS. 2A-2D depict a conceptual diagram of an example computer system for providing seamless application connectivity when only one computing device uses connection aliases. The example system is similar to the system depicted and described above with regard to FIGS. 1A-1D—the example system includes a first computing device M1 (200) that provides seamless connectivity while switching network connections during communication with second computing device M2 (202). However, unlike the second computing device M2 (102), the second computing device M2 (202) depicted in FIGS. 2A-2D does not provide aliases for underlying network connections. The first computing device M1 (200) and the second computing device M2 (202) can be any of a variety of appropriate computing devices, such as mobile computing devices (e.g., smartphones, tablet computing devices, personal digital assistants, mobile media players), laptop computers, desktop computers, and/or computer servers.

Figure 2A:
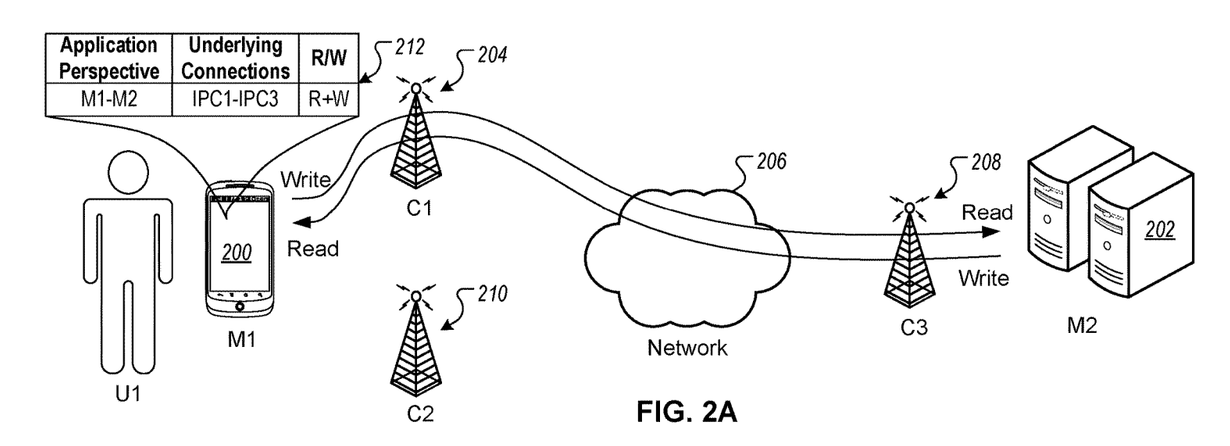
FIGS. 2A-2D depict a conceptual diagram of an example computer system for providing seamless application connectivity when only one computing device uses connection aliases.

Referring to FIG. 2A, the first computing device M1 (200) is communicating with the second computing device M2 (202) over network interface C1 (204) for M1, one or more networks 206, and network interface C3 (208) for M2. The computing devices M1 (200) and M2 (202), the network interfaces C1 (204) and C3 (208), the network (206), and the communication using these computing components can be similar to the computing devices M1 (100) and M2 (102), the network interfaces C1 (104) and C3 (108), and the network (106) described above with regard to FIGS. 1A-1D. Like the table 112, the first computing device M1 (200) can maintain an alias "M1-M2" for the underlying connection "IPC1-IPC3" with the second computing device M2 (202), as depicted in table 212. Unlike the system depicted in FIGS. 1A-1D, the second computing device M2 (202) does not track an alias for the connection between the computing devices M1 (200) and M2 (202). The communication between the first computing device M1 (200) and the second computing device M2 (202) can be bounded in the sense that the transmission has an initial and finite range of data that is being transferred between the two devices M1 (200) and M2 (202). For example, the communication between the first computing device M1 (200) and the second computing device M2 (202) can include transmission of one or more files (e.g., image files, audio files, web pages) between the computing devices.

Figure 2B:
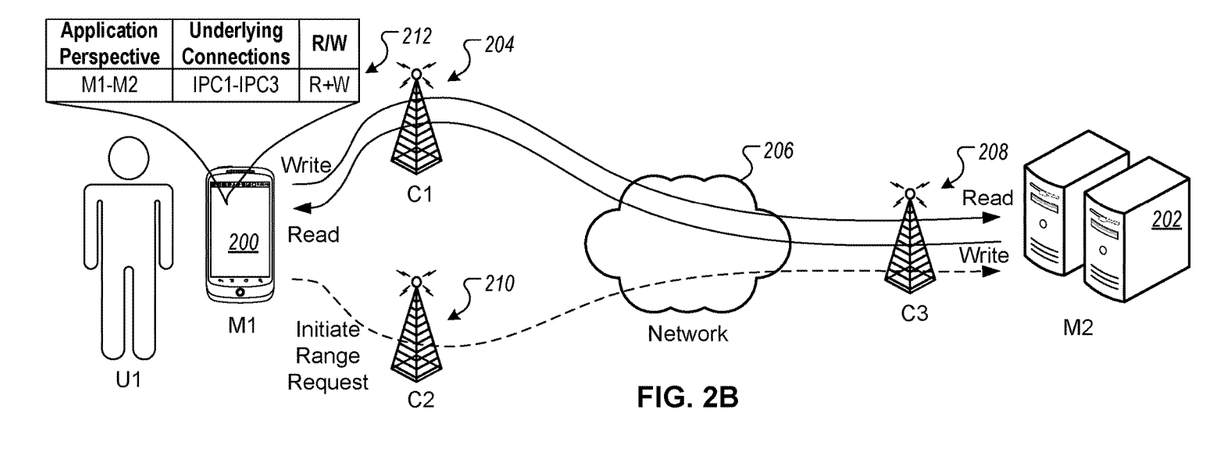

Referring to FIG. 2B, the first computing device M1 (200) can initiate a new connection over network interface C2 (210) with the second computing device M2 (202). The initiation of the new connection over network interface C2 (210) can be based on any of a variety of events, as described above with regard to FIG. 1B. The initiation can also include a range request (e.g., HTTP range request) for a remaining portion of the finite data set that has not yet been requested and/or received from the second computing device M2 (202). For example, if the communication between the first computing device M1 (200) and the second computing device M2 (202) is for the purpose of transferring a file with data 0-100 and, when the new network connection over network interface C2 (210) is received, the first computing device M1 (200) has received and/or requested up to data 50, then the initiation of the new network connection over network interface C2 (210) can include a range request for data items 51-100.

Figure 2C:
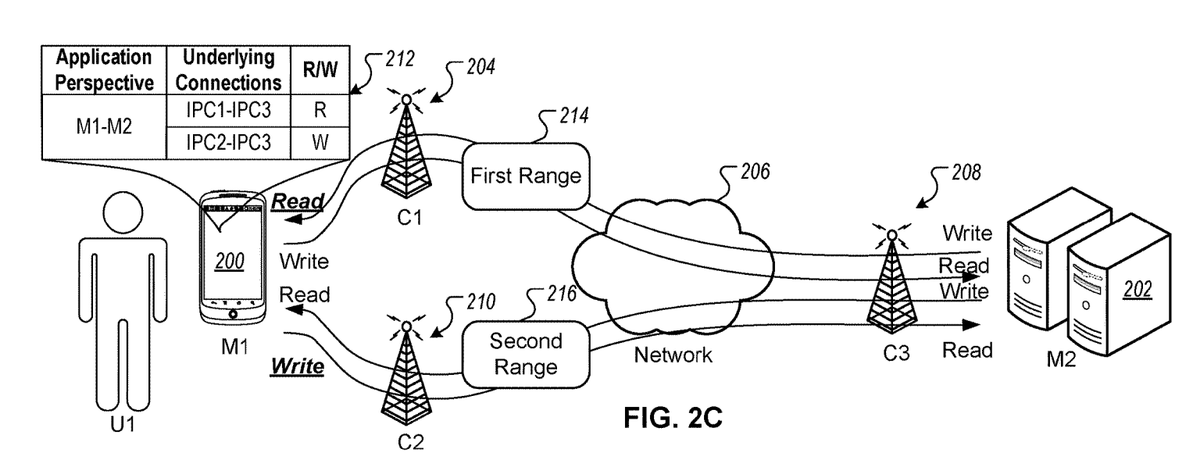

Referring to FIG. 2C, after initiating the new network connection IPC2-IPC3, the first computing device M1 (200) can proceed to use the old network connection IPC1-IPC3 simultaneously with the new network connection IPC2-IPC3. As indicated in the table 212, entries that are associated with the alias M1-M2 can be added and/or modified such that data is read over the old network connection IPC1-IPC3 and data is written over the new network connection IPC2-IPC3. Unlike the configuration identified above with regard to FIGS. 1A-1D in which both endpoints include connection aliasing, in this example the second computing device M2 (202) is not able to bifurcate reading and writing across two different connections. Accordingly, a first range of data (214) is transmitted over the old network connection IPC1-IPC3 in parallel with a second range of data (216) over the new network connection IPC2-IPC3. Reading and writing can occur over both of these connections, as indicated by the dual arrows for each connection. The parallel transmission can occur until the first range of data (214) has been received in full over the old network connection IPC1-IPC3.

Figure 2D:
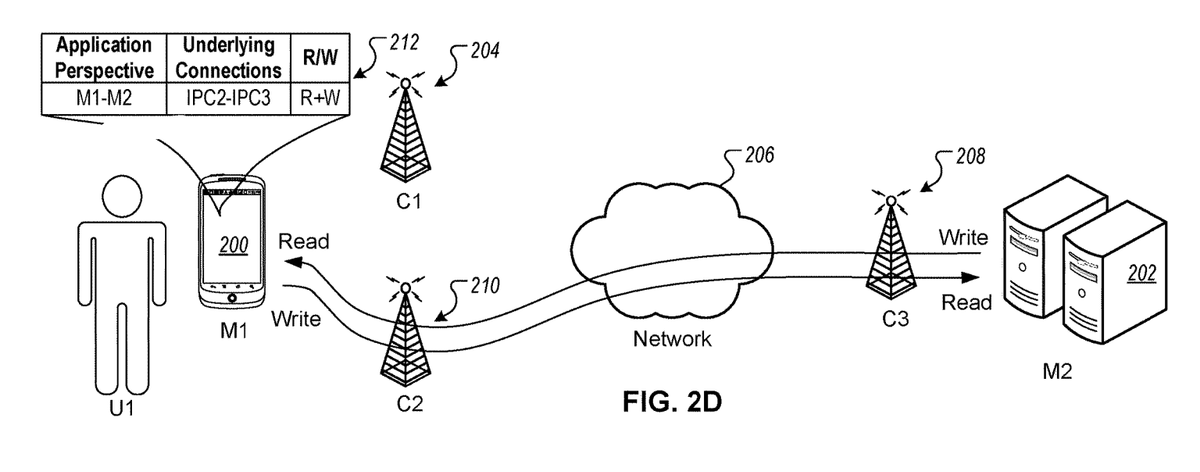

Referring to FIG. 2D, after the old network connection IPC1-IPC3 has been terminated, the first computing device M1 (200) and the second computing device M2 (202) can transition to using only the new network connection IPC2-IPC3. This transition can be made complete by updating the entries in the table 212. For instance, the entry for the old network connection IPC1-IPC3 can be removed from the table 212, and the entry for the new network connection IPC2-IPC3 can be updated to indicate that it is available for both reading and writing ("R+W"). Even though the computing devices M1 and M2 have gone through three separate stages (old connection only, old and new connection simultaneously, and new connection only), the alias for the communication between the first and second computing device M1 and M2 has remained consistent ("M1-M2") during the transition. Such consistency in spite of a new address (IPC2) being introduced for the first computing device M1 (200) can permit applications and other computing entities (e.g., services, programs) that are running on the first computing device M1 (200) to continue to transmit data to the second computing device M2 without interruption and without having to be modified themselves to handle such situations.

Figure 3:
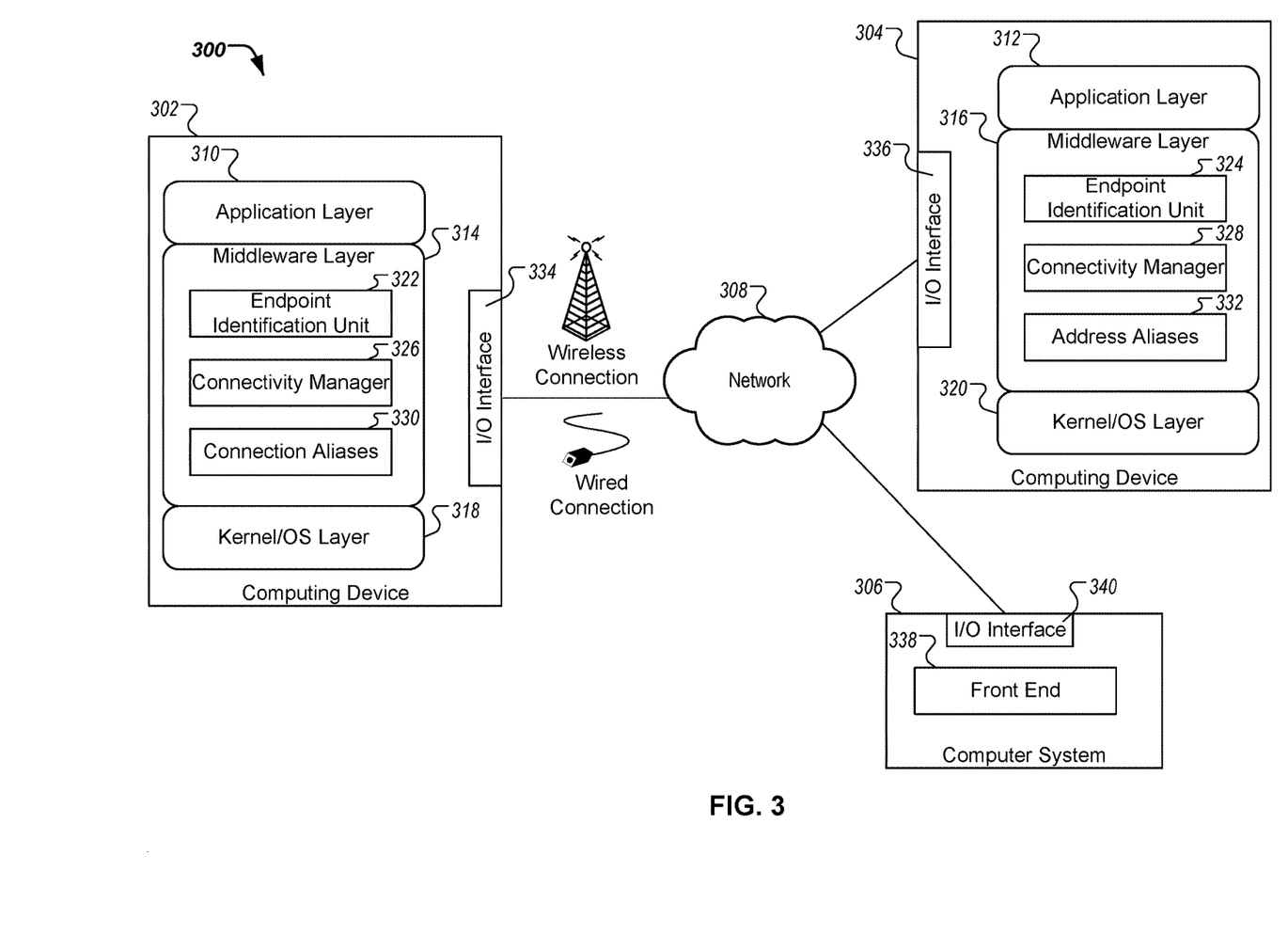
FIG. 3 depicts an example computer system for providing seamless connectivity between computing devices.

FIG. 3 depicts an example computer system 300 for providing seamless connectivity between computing devices. The example system 300 can be similar to the systems described above with regard to FIGS. 1A-1D and 2A-2D. The example system 300 includes computing device 302 and 304 that are configured to provide connection aliasing. The example system 300 also includes a computer system 306 that is not configured to provide connection aliasing, and a communication network 308 over which the computing devices 302 and 304, and the computer system 306 can communicate.

The computing devices 302 and 304, and the computer system 306 can be any of a variety of appropriate computing devices and/or systems, such as mobile computing devices (e.g., smartphones, tablet computing devices, personal digital assistants, mobile media players), laptop computers, desktop computers, and/or computer servers. The network 308 can include one or more appropriate communication networks, such as the internet, a local area network (LAN), and/or a wide area network (WAN), a virtual private network (VPN).

The computing devices 302 and 304 include application layers 310 and 312 that can be used by applications running on these devices to communicate over the network 308 with each other. The application layer can use one or more of a variety of appropriate application layer protocols, such as application layer protocols HTTP, FTP, RTP, and/or RTSP.

The application layers 310 and 312 can interface with middleware layers 314 and 316, which are situated between the application layers 310/312 and kernel/OS layers 318 and 320. The middleware layers 314 and 316 can provide the connection aliasing features that are described above with regard to FIGS. 1A-1D and 2A-2D. The middleware layers 314 and 316 can include endpoint identification units 322 and 324, connectivity managers 326 and 328, and connection aliases 330 and 332. The endpoint identification units 322/324 can determine whether the endpoint device during a communication is capable of using connection aliasing to provide seamless connectivity. Such determinations can be used by polling the other endpoint device (while initiating and/or during communication) for connection aliasing functionality. The connectivity managers 326/328 can manage the transition from using a first network connection to simultaneously using first and second network connection, and ultimately to using only the second network connection, as depicted in and described with regard to FIGS. 1A-1D and 2A-2D. The connectivity managers 326/328 can manage seamless connectivity using the connection aliases 330/332, such as the example connection aliases that are depicted in the tables 112, 114, and 212.

The computing devices 302 and 304 can include input/output (I/O) interfaces 334 and 336, which can transmit and receive information over the network 308. The I/O interfaces 334 and 336 can be any of a variety of appropriate interfaces, such as wireless interfaces (e.g., WiFi card, mobile data network chip) and/or wired interfaces (e.g., Ethernet card). The I/O interfaces can access and communicate over the network 308 through any of a variety of appropriate network connections using any of a variety of appropriate interfaces and protocols. For example, the network connections can be wireless network connections (e.g., WiFi connections, mobile data network connections (e.g., 3G wireless connection, 4G wireless connection), BLUETOOTH connection) and/or wired network connections (e.g., Ethernet connection, tethered data connection).

Seamless connectivity between the computing devices 302 and 304 can be performed similar to the techniques described above with regard to FIGS. 1A-1D and, for bounded data set, similar to the techniques described above with regard to FIGS. 2A-2D.

The computer system 306 can be similar to the computing devices 302 and 304, but may not include a middleware layer. In contrast, the computer system 306 may include a front end 338 to respond to requests from other computing devices over the network 308, such as requests for particular files and/or data. The computer system 306 can communicate over the network using an I/O interface 340, which can be similar to the I/O interfaces 334 and 336.

Seamless connectivity between the computing device 302 (or 304) and the computer system 306 can be performed similar to the techniques described above with regard to FIGS. 2A-2D.

Figure 4:
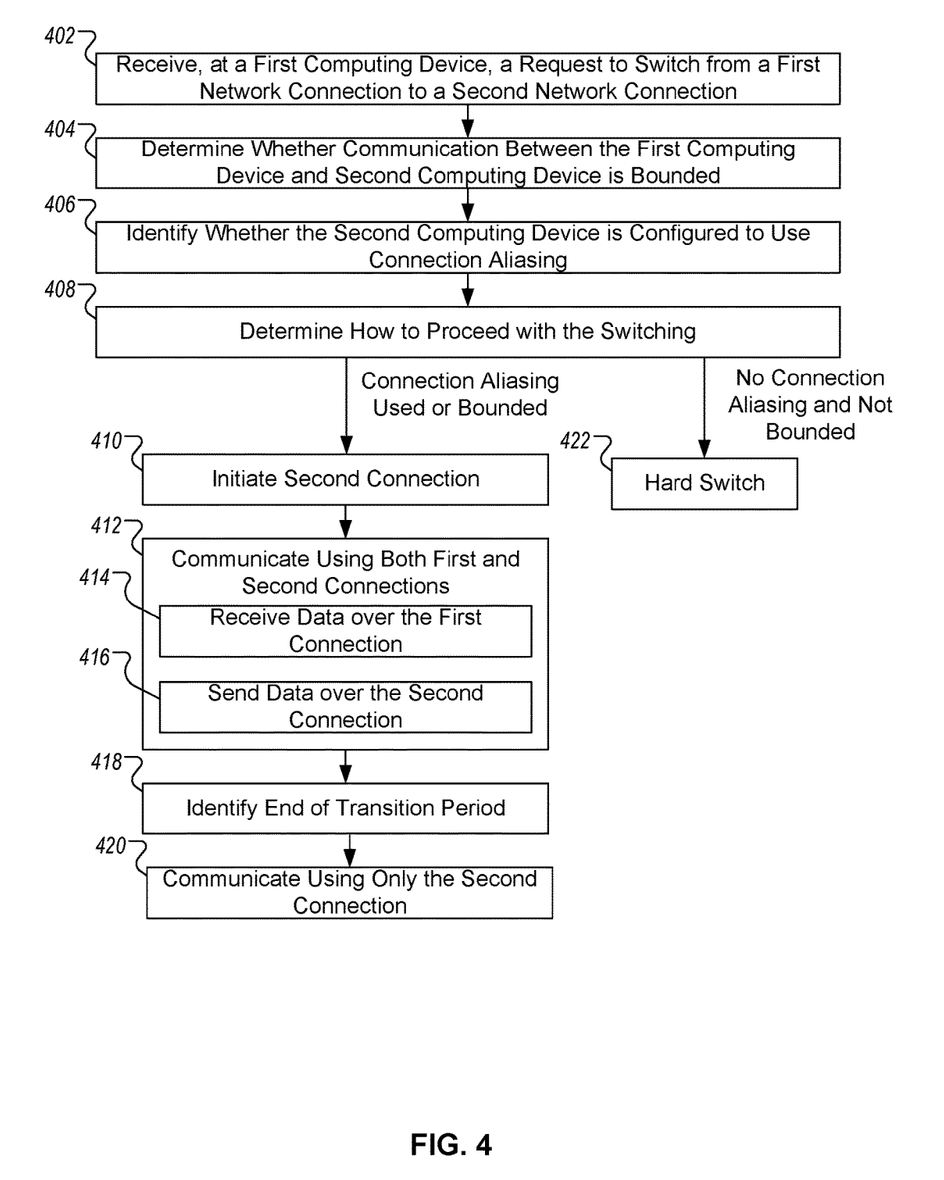
FIG. 4 is a flowchart of an example technique for providing seamless connectivity for communication between computing devices.

FIG. 4 is a flowchart of an example technique 400 for providing seamless connectivity for communication between computing devices. The example technique 400 can be performed by any of a variety of appropriate computing devices, such as the computing devices 100, 102, 200, 202, 302, and/or 304. The example technique 400 may be performed by a middleware layer, such as the middleware layer 314 or 316. Other appropriate processing components may also perform the technique 400.

At a first computing device, a request is received to switch from a first network connection to a second network connection (402). For example, the first computing device M1 (100) may receive a request to switch to using the network connection over network interface C2 (110) based on one or more automatic switching rules (e.g., switch from a mobile data network to a WiFi connection when WiFi is available) and/or one or more inputs from the user U1 (e.g., manual selection of second network connection).

A determination can be made as to whether the communication between the first computing device and the second computing device is bounded (404). For example, the first computing device M1 (100) can identify a type of communication with the second computing device M2 (102), such as streaming versus file transfer, to determine whether the communication is bounded.

The second computing device can be polled to determine whether it is capable of using connection aliasing (406). For example, the first computing device 100 can transmit a request to the second computing device 102 asking whether the second computing device 102 is capable of aliasing the connection between the first and second computing devices. In such an example, the second computing device 102 would respond in the affirmative.

A determination can be made as to how to proceed with the requested switch to the second network connection based, at least in part, on whether the data transmission is bounded and/or whether the second computing device is capable of using connection aliasing (408). When either connection aliasing is determined to be available on the second computing device or the data transmission is determined to be bounded, then the second connection can be initiated while the first network connection is still open and usable (410). For example, the first computing device 100 can open the second connection IPC2-IPC3 while the first connection IPC1-IPC3 is still and being used.

Communication using both the first and second network connections can proceed (412). Such communication can involve receiving data over the first network connection (414) and sending data over the second network connection (416). For example, the first computing device 100 can write (send) data to the second computing device 102 using the second network connection IPC2-IPC3 and can read (receive) data from the second computing device 102 using the first network connection IPC1-IPC3.

An end of the transition period can be identified (418). For example, the first computing device 100 can receive notification that the first connection IPC1-IPC3 has been closed by the second computing device 102.

After identifying the end of the transition period, the first computing device and proceed to communicate using only the second network connection (420). For example, after closing the first network connection IPC1-IPC3, the first computing device 100 proceeds to communicate with the second computing device 102 using only the second network connection IPC2-IPC3.

Figure 5:
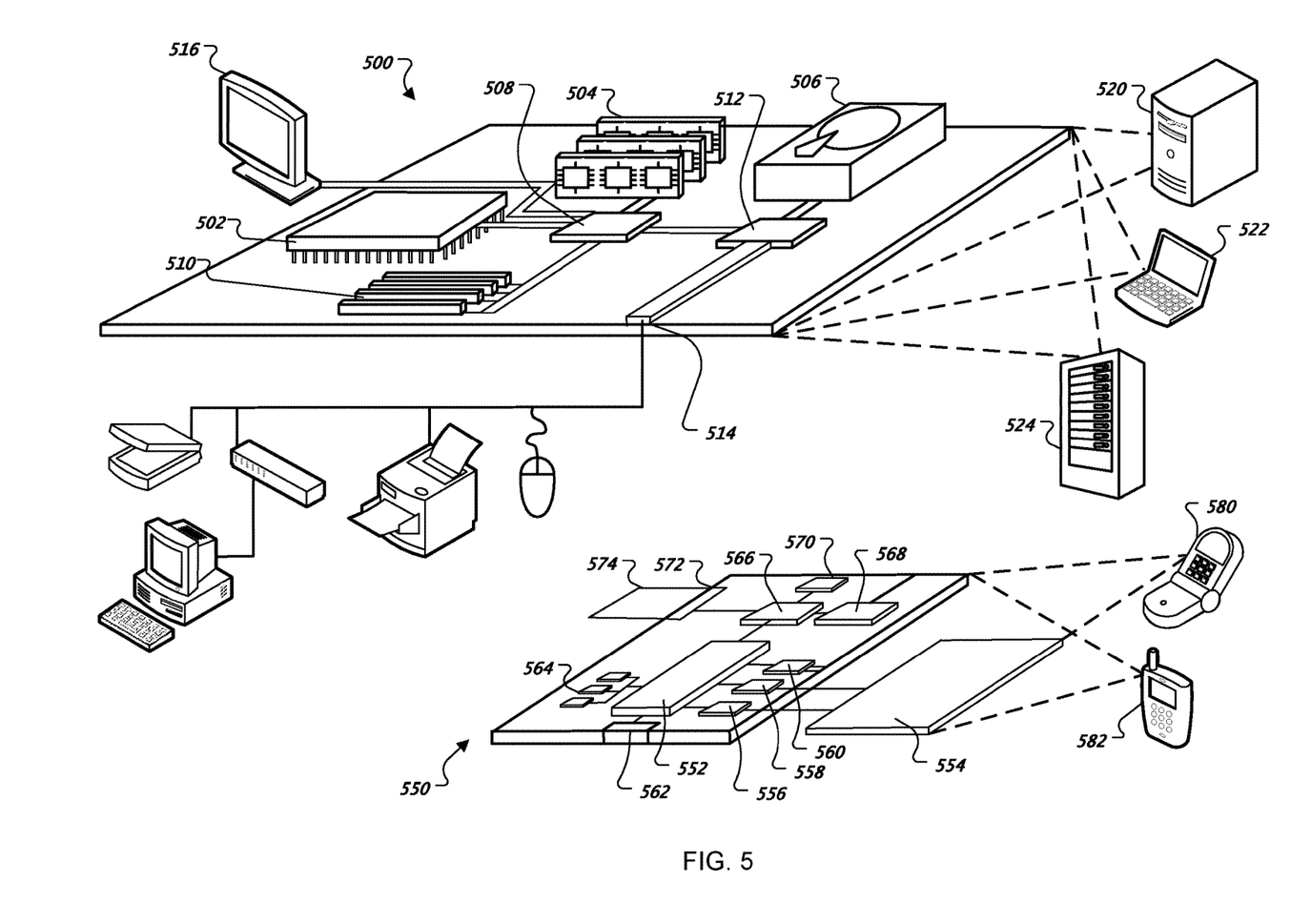
FIG. 5 shows an example of a computer device and a mobile computer device that can be used to implement the techniques described herein.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, and other similar computing devices. Additionally computing device 500 or 550 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be exemplary only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 504 stores information within the computing device 500. In one implementation, the memory 504 is a volatile memory unit or units. In another implementation, the memory 504 is a non-volatile memory unit or units. The memory 504 may also be another form of computer-readable medium, such as a magnetic or optical disk.

The storage device 506 is capable of providing mass storage for the computing device 500. In one implementation, the storage device 506 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of functions is exemplary only. In one implementation, the high-speed controller 508 is coupled to memory 504, display 516 (e.g., through a graphics processor or accelerator), and to high-speed expansion ports 510, which may accept various expansion cards (not shown). In the implementation, low-speed controller 512 is coupled to storage device 506 and low-speed expansion port 514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can execute instructions within the computing device 550, including instructions stored in the memory 564. The processor may be implemented as a chipset of chips that include separate and multiple analog and digital processors. Additionally, the processor may be implemented using any of a number of architectures. For example, the processor 552 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT (Thin-Film-Transistor Liquid Crystal Display) display or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may be provide in communication with processor 552, so as to enable near area communication of device 550 with other devices. External interface 562 may provide, for example, for wired communication in some implementations, or for wireless communication in other implementations, and multiple interfaces may also be used.

The memory 564 stores information within the computing device 550. The memory 564 can be implemented as one or more of a computer-readable medium or media, a volatile memory unit or units, or a non-volatile memory unit or units. Expansion memory 574 may also be provided and connected to device 550 through expansion interface 572, which may include, for example, a SIMM (Single In Line Memory Module) card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provide as a security module for device 550, and may be programmed with instructions that permit secure use of device 550. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552 that may be received, for example, over transceiver 568 or external interface 562.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS (Global Positioning System) receiver module 570 may provide additional navigation- and location-related wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound (e.g., voice messages, music files, etc.) and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

The invention claimed is:

1. A method comprising:
    receiving, by a first device in communication with a second device over a first network connection, a request to switch from using the first network connection to using a second network connection for communication between the first device and the second device;
    while maintaining the first network connection between the first device and the second device, establishing, by the first device, the second network connection between the first device and the second device;
    while maintaining both (i) the first network connection between the first device and the second device and (ii) the second network connection between the first device and the second device, mapping, by the first device, the first network connection and the second network connection to a single connection alias that represents, to applications running on the first device, both the first network connection and the second network connection as a single network connection, the single connection alias including an identifier of the first device and an identifier of the second device;
    after mapping the first network connection and the second network connection to the single connection alias and during a period of time:

receiving, by the first device and from the second device, data over the first network connection and not over the second network connection, and transmitting, by the first device and to the second device, data over the second network connection and not over the first network connection; and after the period of time has elapsed:

terminating the first network connection, receiving, by the first device and from the second device, data over the second network connection and not over the first network connection that has terminated, and transmitting, by the first device and to the second device, data over the second network connection and not over the terminated first network connection.

2. The method of claim 1, wherein mapping the first network connection and the second network connection to the single connection alias comprises:

assigning the first network connection for receiving data at the first device from the second device when using the single connection alias; and assigning the second network connection for transmitting data from the first device to the second device when using the single connection alias.

3. The method of claim 1, wherein mapping the first network connection and the second network connection to the single connection alias comprises:

mapping the first network connection for receiving data by the first device using the single connection alias, and mapping the second network connection for transmitting data by the first device using the single connection alias.

4. The method of claim 1, wherein communicating during the period of time using both the first network connection and the second network connection comprises:

managing communications between the first device and second device over both the first network connection and the second network connection using a middleware layer that is running on the first device, the middleware layer acting as an intermediate network layer between an application layer of the first device and a kernel layer of the first device.

5. The method of claim 4, wherein communicating during the period of time using both the first network connection and the second network connection comprises:

using, by the application layer, the single communication alias to communicate with the second device.

6. The method of claim 1, wherein mapping the first network connection and the second network connection to the single connection alias comprises:

updating the single connection alias to split communications of an application over the first network connection and the second network connection.

7. The method of claim 1, wherein mapping the first network connection and the second network connection to the single connection alias comprises:

mapping the network connections so that (i) the first network connection is assigned as a read-only connection of the first device with the second device, and (ii) the second network connection is assigned as a write-only connection of the first device with the second device.

8. The method of claim 7, wherein communicating during the period of time using both the first network connection and the second network connection comprises:

concurrently (i) receiving data by the first device from the second device over the first network connection, and (ii) sending data from the first device to the second device over the second network connection.

9. The method of claim 7, further comprising, after the end of the period of time, mapping only the second network connection to the single connection alias, the second network connection being assigned for sending and receiving data between the first device and the second device.

10. The method of claim 1, wherein mapping the first network connection and the second network connection to the single connection alias comprises:

updating the single connection alias to represent two different pairs of IP addresses.

11. The method of claim 1, wherein the first device has a first network interface assigned a first IP address, and the first device has a second network interface assigned a second IP address, the second IP address being different from the first IP address;

wherein mapping the first network connection and the second network connection to the single connection alias comprises:

designating a connection between the first IP address and a third IP address for the second device; and designating the single connection alias to use a connection between the first IP address and a third IP address for the second device.

12. A non-transitory machine-readable medium storing instructions that, when executed, cause a data processing apparatus to perform operations comprising:

receiving, by a first device in communication with a second device over a first network connection, a request to switch from using the first network connection to using a second network connection for communication between the first device and the second device;

while maintaining the first network connection between the first device and the second device, establishing, by the first device, the second network connection between the first device and the second device;

while maintaining both (i) the first network connection between the first device and the second device and (ii) the second network connection between the first device and the second device, mapping, by the first device, the first network connection and the second network connection to a single connection alias that represents, to applications running on the first device, both the first network connection and the second network connection as a single network connection, the single connection alias including an identifier of the first device and an identifier of the second device;

after mapping the first network connection and the second network connection to the single connection alias and during a period of time:

receiving, by the first device and from the second device, data over the first network connection and not over the second network connection, and transmitting, by the first device and to the second device, data over the second network connection and not over the first network connection; and after the period of time has elapsed:

terminating the first network connection, receiving, by the first device and from the second device, data over the second network connection and not over the first network connection that has terminated, and transmitting, by the first device and to the second device, data over the second network connection and not over the terminated first network connection.

13. The non-transitory machine-readable medium of claim 12, wherein mapping the first network connection and the second network connection to the single connection alias comprises:
   updating the single connection alias to split communications of an application over the first network connection and the second network connection.

14. The non-transitory machine-readable medium of claim 12, wherein mapping the first network connection and the second network connection to the single connection alias comprises:
   mapping the network connections so that (i) the first network connection is assigned as a read-only connection of the first device with the second device, and (ii) the second network connection is assigned as a write-only connection of the first device with the second device.

15. A device comprising:
   one or more processors; and
   an interface that is programmed to receive a request to switch from using a first network connection to using a second network connection for communicating with a second device; and
   a connectivity manager that is configured to:
      while maintaining the first network connection between the first device and the second device, establish, by the first device, the second network connection between the first device and the second device;
      while maintaining both (i) the first network connection between the first device and the second device and (ii) the second network connection between the first device and the second device, map, by the first device, the first network connection and the second network connection to a single connection alias that represents, to applications running on the first device, both the first network connection and the second network connection as a single network connection, the single connection alias including an identifier of the first device and an identifier of the second device;
      after mapping the first network connection and the second network connection to the single connection alias and for a period of time:
         receive, by the first device and from the second device, data over the first network connection and not over the second network connection, and
         transmit, by the first device and to the second device, data over the second network connection and not over the first network connection; and
      after the period of time has elapsed:
         terminate the first network connection,
         receive, by the first device and from the second device, data over the second network connection and not over the first network connection that has terminated, and
         transmit, by the first device and to the second device, data over the second network connection and not over the terminated first network connection.

16. The device of claim 15, wherein the connectivity manager is configured to map the first network connection and the second network connection to the single connection alias by updating the single connection alias to split communications of an application over the first network connection and the second network connection.

17. The device of claim 15, wherein the connectivity manager is configured to map the first network connection and the second network connection to the single connection alias by mapping the network connections so that (i) the first network connection is assigned as a read-only connection for communicating with the second device, and (ii) the second network connection is assigned as a write-only connection for communicating with the second device.

* * * * *

UNITED STATES PATENT AND TRADEMARK OFFICE
CERTIFICATE OF CORRECTION

PATENT NO. : 10,244,451 B2  
APPLICATION NO. : 14/967550  
DATED : March 26, 2019  
INVENTOR(S) : Jain Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 159 days.

Signed and Sealed this  
Tenth Day of December, 2019

Andrei Iancu  
*Director of the United States Patent and Trademark Office*